(12) United States Patent
Kuraya

(10) Patent No.: US 10,475,949 B2
(45) Date of Patent: Nov. 12, 2019

(54) OPTICAL COUPLING DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Hidetoshi Kuraya, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/916,540

(22) Filed: Mar. 9, 2018

(65) Prior Publication Data
US 2019/0006551 A1  Jan. 3, 2019

(30) Foreign Application Priority Data

Jun. 29, 2017  (JP) ................................. 2017-127477

(51) Int. Cl.
*H01L 23/495* (2006.01)
*H01L 31/167* (2006.01)
(Continued)

(52) U.S. Cl.
CPC ...... *H01L 31/167* (2013.01); *H01L 23/49534* (2013.01); *H01L 25/167* (2013.01); *H01L 31/0203* (2013.01); *H01L 31/02327* (2013.01); *H01L 31/162* (2013.01); *H04B 10/40* (2013.01); *H01L 23/49537* (2013.01); *H01L 33/56* (2013.01); *H01L 2224/32245* (2013.01);
(Continued)

(58) Field of Classification Search
USPC ... 257/81, 82, 116, 117, 432–437, 457, 495, 257/749, 91, 98–100, E33.056–E33.059, 257/E25.032; 438/25–28, 51, 55, 64–68, 438/83, 98
See application file for complete search history.

(56) References Cited

U.S. PATENT DOCUMENTS 8,729,512 B2  5/2014  Hashizume et al.
2009/0309121 A1*  12/2009  Ito ......................... C08L 83/04
257/99
(Continued)

FOREIGN PATENT DOCUMENTS

JP  H04-152556 A  5/1992
JP  2002-026374 A  1/2002
(Continued)

*Primary Examiner* — Niki H Nguyen
(74) *Attorney, Agent, or Firm* — White & Case LLP

(57) ABSTRACT

An optical coupling device includes a first lead frame, a second lead frame, a first mounting member, a second mounting member, the members respectively provided on the first lead frame and, the second lead frame a light emitter provided on the first mounting member, a light receiver provided on the second mounting member, a first wire and a second wire electrically connecting the light emitter to the first lead frame, and the light receiver to the second lead frame, and an outer resin enclosure enclosing a part of the first lead frame and the second lead frame, the light emitter, and the light receiver, wherein at least the light emitter and the light receiver in the outer resin enclosure are covered with a silicone resin cured material.

13 Claims, 7 Drawing Sheets

(51) Int. Cl.
*H01L 31/0232* (2014.01)
*H01L 31/0203* (2014.01)
*H01L 25/16* (2006.01)
*H01L 31/16* (2006.01)
*H04B 10/40* (2013.01)
*H01L 33/56* (2010.01)

(52) U.S. Cl.
CPC ............... *H01L 2224/48091* (2013.01); *H01L 2224/48247* (2013.01); *H01L 2224/73265* (2013.01); *H01L 2924/181* (2013.01)

(56) References Cited

U.S. PATENT DOCUMENTS

| | | | | |
|---|---|---|---|---|
| 2014/0159062 A1* | 6/2014 | Nomura | ............... | H01L 23/4952 |
| | | | | 257/84 |
| 2015/0262982 A1* | 9/2015 | Muranaka | ............. | H01L 25/165 |
| | | | | 257/82 |
| 2015/0262986 A1* | 9/2015 | Takai | .................... | H01L 25/167 |
| | | | | 257/82 |
| 2016/0093570 A1* | 3/2016 | Watanabe | ............... | H01F 38/14 |
| | | | | 257/531 |
| 2016/0197224 A1 | 7/2016 | Muranaka et al. | | |
| 2016/0322531 A1* | 11/2016 | Koseki | ................... | H01L 31/16 |

FOREIGN PATENT DOCUMENTS

| | | |
|---|---|---|
| JP | 2012-186305 A | 9/2012 |
| JP | 5138924 B2 | 2/2013 |
| JP | 2015-054965 A | 3/2015 |

\* cited by examiner

| Result of Reliabilities | | | | | | |
|---|---|---|---|---|---|---|
| Example | amount of filler | Resin Type | HTS | HTO | PCT | TCT |
| Epoxy resin A | 88 wt% | epoxy/ phenol | — | — | — | — |
| Epoxy resin B | 79 wt% | epoxy/ anhydride | △ | △ | △ | ○ |
| Silicone resin C | 88 wt% | silicone | ○ | ○ | ○ | ○ |
| Silicone resin D | 84 wt% | silicone | ○ | ○ | ○ | ○ |
| Epoxy resin E | 75 wt% | epoxy/ phenol | × | × | ○ | ○ |
| Epoxy resin F | 75 wt% | epoxy/ anhydride | △ | △ | △ | ○ |
| Conditions | | | ○ : 5000hr< △ : 3000hr × : 1000hr at 150℃ | | ○ : 192hr≦ △ : <192hr at 127℃ 100%rh | ○ : 2000cyc. at -55℃~ 150℃ |

FIG. 2

| Example | Resin characteristic | | Wire flow [%] | | Bed clearance variation [%] | |
|---|---|---|---|---|---|---|
| | Spiral flow [cm] | Minimum melt viscosity [Pa·S] | Ave. | Max. | Ave. | Max. |
| Silicone resin G | 56 | 33 | 12.4 | 14.4 | 14.8 | 19.2 |
| Silicone resin H | 71 | 22 | 9.0 | 13.2 | 9.8 | 12.9 |
| Silicone resin I | 99 | 15 | 3.8 | 6.6 | 3.1 | 5.6 |
| Silicone resin J | 135 | 9 | 8.7 | 2.4 | 0.9 | 3.7 |

FIG. 7

OPTICAL COUPLING DEVICE

CROSS-REFERENCE TO RELATED APPLICATIONS

This application is based upon and claims the benefit of priority from Japanese Patent Application No. 2017-127477, filed Jun. 29, 2017, the entire contents of which are incorporated herein by reference.

FIELD

Embodiments described herein generally relate to an optical coupling device.

BACKGROUND

An optical coupling device, which is one example of an optical semiconductor device, has a structure in which an optical element serving as a light emitter or a light receiver is disposed on a lead frame and the optical element is covered with a light transmitting member, such as a resin. In a case where the optical coupling device is used in a strict environment under high temperature and high humidity there are concerns that characteristics of the optical coupling device may be affected due to peeling and thermal deterioration of the resin.

BRIEF DESCRIPTION OF THE DRAWINGS

FIG. 2 is a table showing results of reliability according to the embodiment;

FIG. 7 is a table showing results of fluidity evaluation of multiple silicone resins.

DESCRIPTION OF EMBODIMENTS

Figure 1:
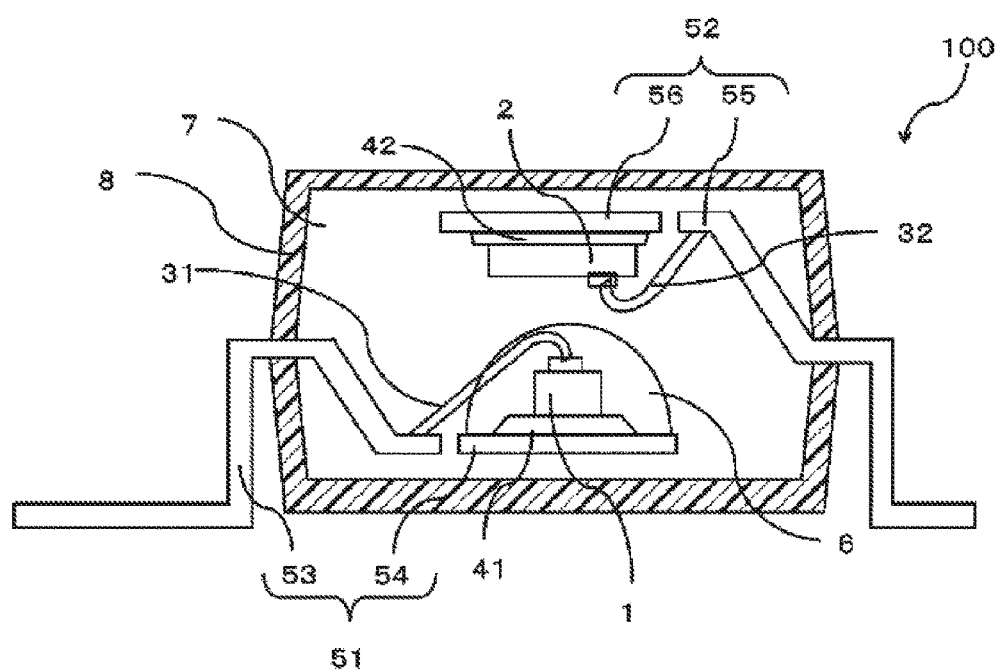
FIG. 1 is a cross-sectional view of an optical coupling device according to an embodiment.

According to one embodiment, an optical coupling device including: a first lead frame and a second lead frame; a first mounting member and a second mounting member respectively provided on the first lead frame and the second lead frame; a light emitter provided on the first mounting member; a light receiver provided on the second mounting member; a first wire and a second wire electrically connecting the light emitter to the first lead frame, and the light receiver to the second lead frame; and an enclosure enclosing a part of the first lead frame and the second lead frame, the light emitter, and the light receiver, wherein at least the light emitter and the light receiver in the enclosure are covered with a silicone resin cured material is provided.

Hereinafter, embodiments will be described with reference to the drawings. In the following description, the same reference numerals are assigned to the same members, and descriptions of members described once are omitted as appropriate.

As illustrated in FIG. 1, an optical coupling device 100 includes a light emitter 1, a light receiver 2, a first wire 31, a second wire 32, a first mounting member 41, a second mounting member 42, a first lead frame 51, a second lead frame 52, an encapsulation resin 6, an inner resin 7, and an outer resin enclosure 8.

The light emitter 1 is, for example, a light emitting diode (LED).

The first and second lead frames 51 and 52 are made of a conductive member such as metal. In addition, the first lead frame 51 includes a first outer lead 53 and a first planar portion 54. The second lead frame 52 includes a second outer lead 55 and a second planar portion 56.

The light emitter 1 is disposed on the first planar portion 54 of the first lead frame 51 through the first mounting member 41. The first outer lead 53 of the first lead frame 51 is electrically connecting to the light emitter 1 by the first wire 31. Similarly, the light receiver 2 is disposed on the second planar portion 56 of the second lead frame 52 through the second mounting member 42. The second outer lead of the second lead frame 52 is electrically connecting to the light receiver 2 by the second wire 32. The wires 31 and 32 are made of, for example, gold, aluminum, or the like.

In addition, the light emitter 1 may be covered with the encapsulation resin 6. The encapsulation resin 6 is preferably provided for alleviating a stress from the inner resin 7 but the encapsulation resin 6 may not be always necessary.

The outer resin enclosure 8 is provided to seal, the light emitter 1, the light receiver 2, the first wire 31, the second wire 32, the mounting member 4, the encapsulation resin 6, the inner resin 7, the first and second planar portions 54, 56, part of the first outer lead 53 of the first lead frame 51, and part of the second outer lead 55 of the second lead frame 52.

A portion of the first outer lead 53 and of the second outer lead 55 protrude outside of the outer resin enclosure 8 so as to be externally connected.

In some embodiments, an epoxy resin cured material is used as the outer resin enclosure 8.

The inside formed by the outer resin enclosure 8 is filled with the inner resin 7. As the inner resin 7, a silicone resin cured material is used.

That is, at least the light emitter and the light receiver are both covered with a silicone resin cured material and a region in the inside of the outer resin enclosure between the first lead frame and the second lead frame is filled with the silicone resin cured material.

In some embodiments, the inside of the outer resin enclosure 8 can be fully filled with the inner resin 7 except for the light emitter 1 covered with the encapsulation resin 6, the light receiver 2, the first lead frame 51, the second lead frame 52, the first wire 31, and the second wire 32.

Next, the effect of the optical coupling device 100 according to the present embodiments will be described by comparing with an optical coupling device as a comparative example. A structure of the comparative example of the optical coupling device is not illustrated here, but it is similar to the structure of the optical coupling device 100 according to the first embodiment. One difference is that an inner resin of the comparative example is made of an epoxy resin although the inner resin 7 according to the present embodiment is made of silicone resin cured material.

Because of a difference of the materials, in the optical coupling device according to the comparative example, a thermal history such as a reflow during mounting or a temperature cycle may cause peelings or the like between the light emitter or the light receiver and the outer resin enclosure and between the outer resin enclosure and the lead frames. In addition, since light intensity changes due to such thermal deterioration, there is concern that the reliability of the optical coupling device may be affected and therefore its characteristics may be changed.

On the other hand, the optical coupling device 100 according to the first embodiment can obtain effects described below, with reference to FIG. 2 to FIG. 5.

FIG. 2 is a table summarizing results of reliabilities of multiple inner resins, each resin has a different kind of component. Inner resins A, B, E, and F are made of epoxy, those of which correspond to the comparative example. Inner resins C and D are made of silicon. An amount of a filler in each resin and a resin type are specifically shown in the table of FIG. 2. If a large amount of the filler is contained in the resin, the expansion amount tends to become low and an elastic modulus tends to become high.

Items of the reliability measurement shown in FIG. 2 are, for example a high temperature storage (HTS), a high temperature operation (HTO), a pressure cooker test (PCT), and a temperature cycling test (TCT).

This measurement is based on JIS-C-60068-2, which is corresponding to IEC-60068-2.

Regarding the HTS and the HTO, a case where there is a resistance more than 5,000 hr (hours) at 150° C. is represented by ○, a case where there is a resistance equivalent to 3,000 hr is represented by Δ, and a case where there is a resistance equivalent to 1,000 hr is represented by x. In addition, regarding the PCT, a case where there is a resistance equivalent to 192 hr at 127° C. and 100% rh (relative humidity) is represented by ○. A case where it does not satisfy this condition is represented by Δ. Regarding the TCT, a case where there is a resistance of 2,000 cycles, each cycle sets a temperature change between a low temperature (for example, −55° C.) and a high temperature (for example, 150° C.), is represented by ○.

FIG. 2 illustrates, that for the components made of an epoxy resin as like the resins A, B, E, and F, sufficient reliability could not be fully secured in the HTS, HTO, and PCT items. On the other hand, as for the components made of silicon like as the resins C, and D, sufficient reliability could be secured in each of the four items, HTS, HTO, PCT, and TCT.

Figure 3:
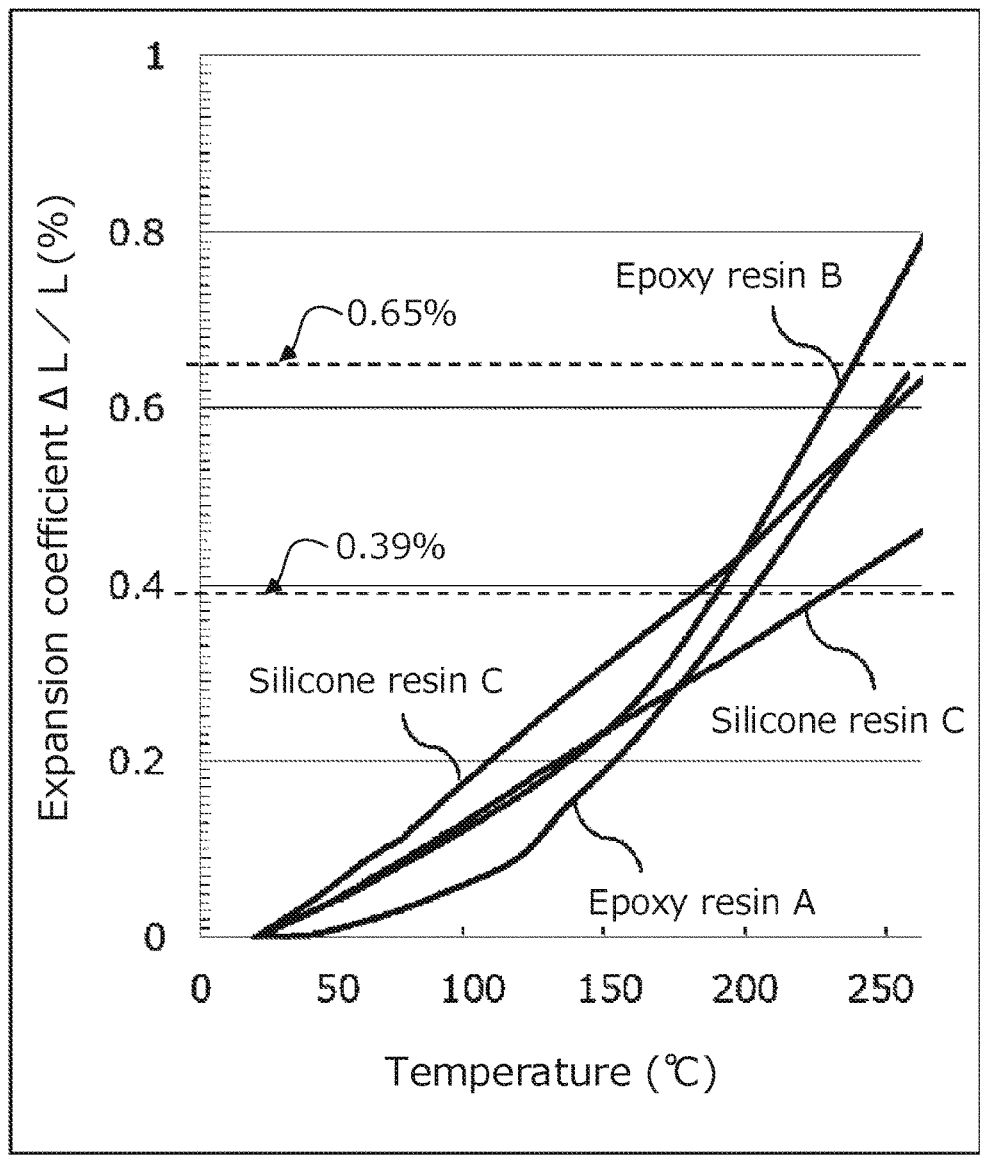
FIG. 3 is a graph showing expansion coefficients with respect to a temperature change.

FIG. 3 is a graph of expansion coefficients with respect to a temperature change from 25° C. to 265° C. At 265° C., the silicone resin C and the silicone resin D of the optical coupling device 100 have an expansion coefficient in the range of 0.65% or less. For a lead frame used in a photo coupler, a Cu base material is mainly used and an expansion rate is 16.8 ppm/° C. Therefore, the expansion coefficient of the lead frame at 25° C. to 265° C. is 0.39%. When the expansion amount and mismatch of the lead frame is smaller, a stress concentration on a composite material interface is reduced, which is advantageous to thermal cycling.

On the other hand, the expansion coefficient of the epoxy resin B of the comparative example of the optical coupling device is as high as 0.79%, and a risk that peeling or the like will occur is increased when the expansion and contraction are repeated by thermal cycling.

Figure 4:
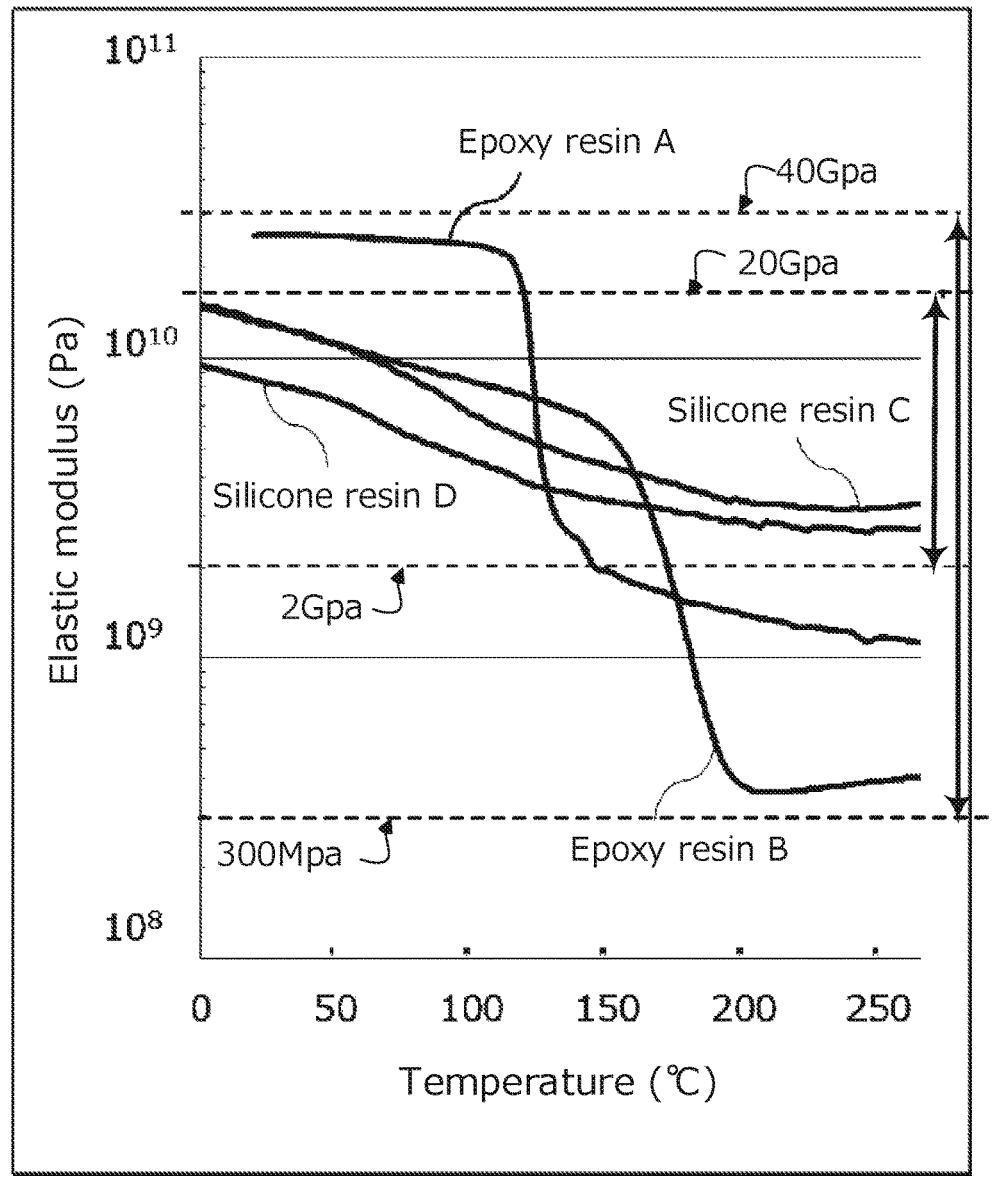
FIG. 4 is a graph showing elastic moduli with respect to a temperature change.

FIG. 4 is a graph of elastic moduli with respect to a temperature change from 25° C. to 265° C. In the temperature change, elastic modulus of the first embodiment of the optical coupling device 100 varies, within a range narrower than the comparative example, from 2 GPa to 20 GPa. On the other hand, in the case of the comparative example of the optical coupling device, elastic modulus decreasingly varies, in a range wider than the first embodiment of the optical coupling device 100, from 300 MPa to 40 GPa. When change in the elastic modulus is great, peeling of the inner resin or deterioration of characteristics of the optical coupling device is more likely to occur. According to the embodiment of the optical coupling device 100, it is difficult to cause the peeling or the deterioration of characteristics because the variation range of the elastic modulus is narrower than the comparative example.

Figure 5:
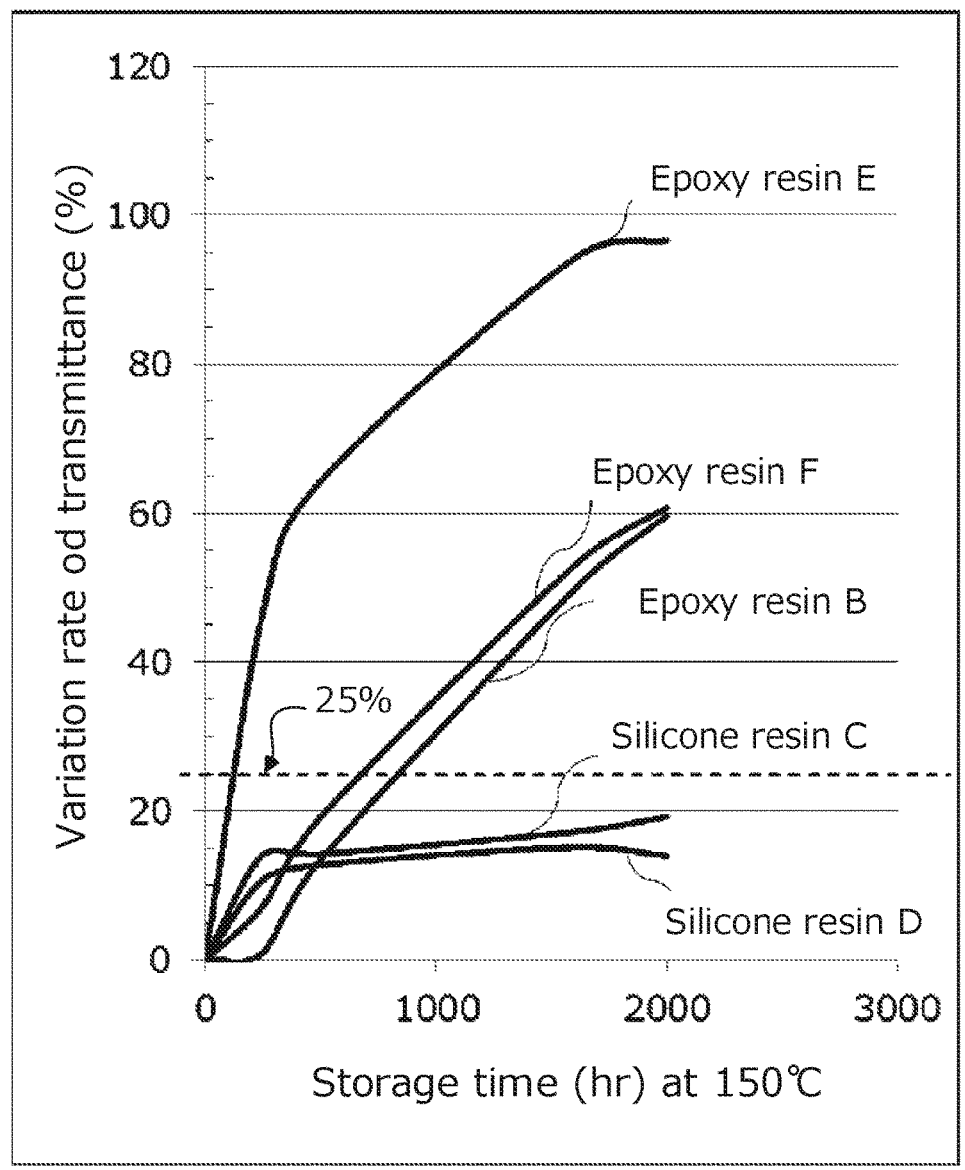
FIG. 5 is a graph showing variation rates of transmittance with respect to a storage time at 175° C.

FIG. 5 is a graph showing variation rates of transmittance with respect to a storage time at 175° C. A variation rate of transmittance of a wavelength of 400 nm or more and initial transmittance in the optical coupling device 100 after storage for from 1,000 hours to 1,500 hours at 175° C. is 25% or less for both the silicone resin C and the silicone resin D. On the other hand, in the case of the epoxy resin B and F of the comparative examples, the variation rate of transmittance is 50% or more, and in the case of the epoxy resin E for 1,500 hours at 175° C. the variation rate exceeds 90%. If the transmittance change according to the temperature change is great, the spectral intensity change and the possibility that the characteristics of the optical coupling device will change increases.

In addition, in the epoxy resin of the comparative example optical coupling device, phenol and acid anhydride can be used for a curing agent. In the case of the phenol, the transmittance is poor at high temperature storage and HTS is not satisfied until determination. In the case of the acid anhydride, the transmittance at high temperature storage improves and the HTS also expands, but a problem arises in the PCT.

As described above, even in a high temperature and high humidity environment, the optical coupling device 100 has little variation in the characteristics of the inner resin 7 and has high reliability.

Furthermore, in some embodiments the first planar portion and the second planar portion are beds. In these embodiments, the bed clearance may increase due to the influence of mold injection. When the bed clearance increases, deterioration of optical characteristics increases. Thus, it is desirable that the bed clearance variation becomes small.

Figure 6:
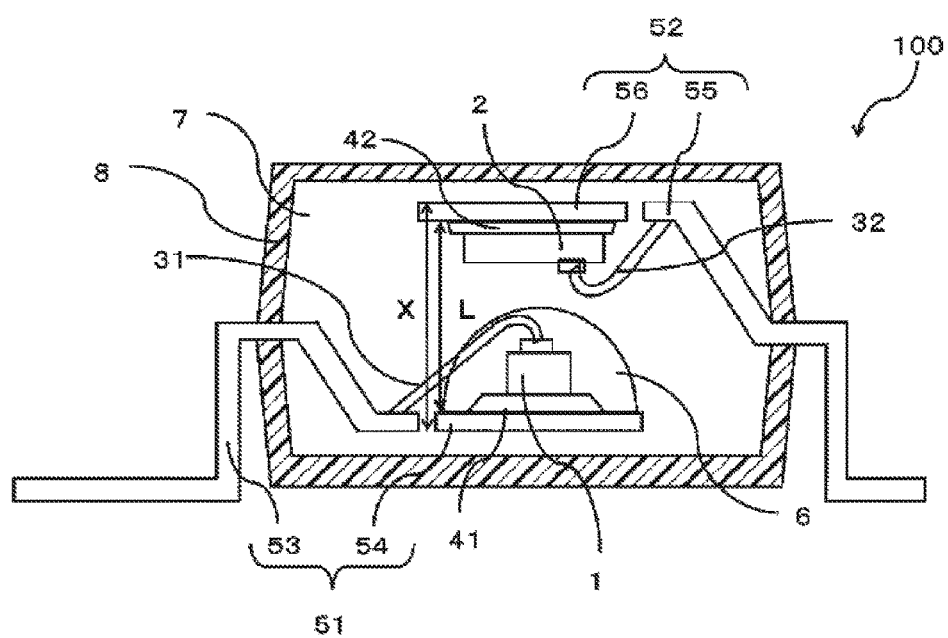
FIG. 6 is an explanatory view of bed clearance according to the optical coupling device.

FIG. 6 is an explanatory view of a bed clearance according to some embodiments of the optical coupling device 100. As illustrated in FIG. 6, when L is a design value between the first lead frame and the second lead frame and X is a cross-section polishing measurement value after molding, a bed clearance variation can obtain from Equation (1) below.

$$\text{Bed clearance variation (\%)} = (X/L) \times 100 \quad (1)$$

This variation can be suppressed when a resin viscosity is low.

In addition, a wire flow may occur during molding (resin injection). When L' is a design value between semiconductor chips and X' is a wire direction measurement value connecting semiconductor chips with respect to a molding resin injection direction, a wire flow rate can be obtained from Equation (2) below.

$$\text{Wire flow rate} = (X'/L') \times 100 \quad (2)$$

When the wire flow occurs, there is a risk of electrical short-circuit between sealing processes.

FIG. 7 is a table of results of experimental examples obtained by evaluating fluidity for multiple silicone resin materials G, H, I, and J in an injection mold. The silicone resin materials G to J have not been cured and are subjected to different filler adjustments with a filling amount of 80 wt %, or more, of the resulting silicone resin material. A flow test mold having a spiral shape tube which is filled such resin material poured from an opening of the tube is used for the evaluation under a certain experimental conditions. A length reached by the resin is defined as a spiral flow in the table.

FIG. 7 further shows resin characteristics, wire flow, and bed clearance variation of the optical coupling devices 100 for each case of the resin materials G, H, I, and J. In the embodiments of the optical coupling devices 100 using the silicone resin materials I and J, the wire flow rate is 10% or less and the bed clearance variation is 10% or less (at average value and maximum value).

As described above, in order to keep the wire flow rate to 10% or less and the bed clearance variation to 10% or less, when the filler amount is 80 wt % or more, it is preferable that the spiral flow is 80 cm or more and the minimum melt viscosity is 20 Pa·s or less.

While embodiments of the present invention have been described, these embodiments have been presented by way of example only, and are not intended to limit the scope of the invention. These novel embodiments can be implemented in a variety of other forms; furthermore, various omissions, substitutions, and changes can be made without departing from the spirit of the invention. These embodiments and modifications thereof are included in the scope and gist of the invention and are included in the invention described in the claims and the equivalents thereof.

What is claimed is:

1. An optical coupling device comprising:
   an enclosure;
   a first lead frame and a second lead frame;
   a first mounting member and a second mounting member provided on the first lead frame and the second lead frame, respectively;
   a light emitter provided on the first mounting member within the enclosure;
   a light receiver provided on the second mounting member inside the enclosure;
   a first wire and a second wire electrically connecting the light emitter to the first lead frame, and the light receiver to the second lead frame, respectively; and
   a silicone resin cured material disposed inside the enclosure;
   wherein,
   an expansion rate of 25° C. to 265° C. in the silicone resin cured material is in a range of 0.39% to 0.65%,
   the first lead frame comprises a first outer lead and a first planar portion on which the first mounting member is provided,
   the second lead frame is arranged opposed to the first lead frame and comprises a second outer lead and a second planar portion on which the second mounting member is provided, and
   a region inside the enclosure between the first lead frame and the second lead frame is filled with the silicone resin cured material and without an epoxy resin material.

2. The optical coupling device according to claim 1 further comprising,
   an encapsulation resin formed on and covering the light emitter.

3. The optical coupling device according to claim 2, wherein inside of the enclosure is fully filled with the silicone resin cured material.

4. The optical coupling device according to claim 2, wherein the encapsulation resin and the silicone resin are configured to relax stress between the encapsulation resin and the silicone resin.

5. The optical coupling device according to claim 2, wherein the encapsulation resin is a different material from the silicone resin.

6. The optical coupling device according to claim 2, wherein the enclosure is made of epoxy resin cured material.

7. The optical coupling device according to claim 1, wherein an elastic modulus of 25° C. to 265° C. in the silicone resin cured material varies in a range of 2 GPa to 20 GPa.

8. The optical coupling device according to claim 1, wherein a variation rate of the silicone resin cured material between initial transmittance at a wavelength of 400 nm or more and transmittance after storage at 175° C. for from 1,000 hours to 1,500 hours is 25% or less.

9. The optical coupling device according to claim 1, wherein the silicone resin cured material comprises a silicone resin and an inorganic filler comprises 80 wt % with respect to the silicone resin cured material.

10. The optical coupling device according to claim 9, wherein a minimum melt viscosity of the silicone resin cured material is 20 Pa·s or less.

11. The optical coupling device according to claim 9, wherein a spiral flow of the silicone resin material which has not been cured is 80 cm or more.

12. The optical coupling device according to claim 9, wherein a minimum melt viscosity of the silicone resin cured material is 20 Pa·s or less and a spiral flow of the silicone resin cured material is 80 cm or more.

13. The optical coupling device according to claim 1, wherein the first planar portion is a first bed and the second planar portion is a second bed.

* * * * *